US012516833B2

United States Patent
Lian et al.

(10) Patent No.: US 12,516,833 B2
(45) Date of Patent: Jan. 6, 2026

(54) HEAT EXCHANGE MODULE AND CABINET

(71) Applicant: Huawei Digital Power Technologies Co., Ltd., Shenzhen (CN)

(72) Inventors: Zhisheng Lian, Dongguan (CN); Xuechao Zhang, Dongguan (CN); Hengqu Li, Dongguan (CN); Hongbing Wang, Dongguan (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 375 days.

(21) Appl. No.: 18/152,276

(22) Filed: Jan. 10, 2023

(65) Prior Publication Data

US 2023/0167991 A1    Jun. 1, 2023

Related U.S. Application Data

(63) Continuation of application No. PCT/CN2020/102216, filed on Jul. 15, 2020.

(51) Int. Cl.
| | |
|---|---|
| *F24F 7/08* | (2006.01) |
| *F24F 13/10* | (2006.01) |
| *H05K 7/18* | (2006.01) |
| *H05K 7/20* | (2006.01) |

(52) U.S. Cl.
CPC ............... *F24F 7/08* (2013.01); *F24F 13/10* (2013.01); *H05K 7/186* (2013.01); *H05K 7/20172* (2013.01)

(58) Field of Classification Search
CPC . F24F 7/08; F24F 13/10; H05K 7/186; H05K 7/20172

USPC .......................................................... 454/184
See application file for complete search history.

(56) References Cited

U.S. PATENT DOCUMENTS

| | | | |
|---|---|---|---|
| 3,559,728 A * | 2/1971 | Lyman .................. | H05K 7/206 165/122 |
| 6,164,369 A | 12/2000 | Stoller | |
| 8,503,178 B2 * | 8/2013 | Chen ..................... | H05K 7/202 361/679.48 |
| 9,326,426 B2 * | 4/2016 | James ................ | H05K 7/20572 |

(Continued)

FOREIGN PATENT DOCUMENTS

| | | |
|---|---|---|
| CN | 1170482 A | 1/1998 |
| CN | 100516670 C | 7/2009 |

(Continued)

*Primary Examiner* — Avinash A Savani
*Assistant Examiner* — Dana K Tighe
(74) *Attorney, Agent, or Firm* — Maier & Maier, PLLC

(57) ABSTRACT

The heat exchange module is used in the cabinet that includes a cabinet body. The cabinet body has a first space and a second space. A temperature of the first space is higher than a temperature of the second space. The heat exchange module has a first air circulation system and a second air circulation system, and heat exchange may be performed between the first air circulation system and the second air circulation system. Both an air intake vent and an air exhaust vent of the first air circulation system are configured to be connected to the first space. An air exhaust vent of the second air circulation system is connected to an external space, and an air intake vent of the second air circulation system can be configured to be selectively connected to the external space and/or the second space.

11 Claims, 9 Drawing Sheets

(56) References Cited

U.S. PATENT DOCUMENTS

| | | | |
|---|---|---|---|
| 10,292,303 B2 * | 5/2019 | Cacho Alonso | H05K 7/206 |
| 10,398,062 B2 * | 8/2019 | Huang | F28D 1/024 |
| 10,451,295 B2 * | 10/2019 | James | F24F 13/14 |
| 11,191,191 B2 * | 11/2021 | Krippner | H05K 7/2039 |
| 2003/0094006 A1 | 5/2003 | Des Champs et al. | |
| 2020/0329585 A1 * | 10/2020 | Fuller | H05K 7/20381 |

FOREIGN PATENT DOCUMENTS

| | | |
|---|---|---|
| CN | 101634477 A | 1/2010 |
| CN | 201536316 U | 7/2010 |
| CN | 201541419 U | 8/2010 |
| CN | 101634535 B | 5/2013 |
| CN | 106931518 A | 7/2017 |

* cited by examiner

HEAT EXCHANGE MODULE AND CABINET

CROSS-REFERENCE TO RELATED APPLICATIONS

This application is a continuation of International Application No. PCT/CN2020/102216, filed on Jul. 15, 2020, the disclosure of which is hereby incorporated by reference in its entirety.

TECHNICAL FIELD

The embodiments relate to the field of heat exchange technologies, a heat exchange module, and a cabinet.

BACKGROUND

A device (for example, a communication device such as a base station) in a cabinet (for example, an outdoor cabinet) emits a large amount of heat in a running process. However, when the device operates at a high temperature, performance of the device is degraded or even a service life of the device is shortened. Therefore, the cabinet needs to be equipped with a heat exchange module as a heat dissipation apparatus, to reduce a temperature in a chamber in which the device is located.

However, the heat exchange module equipped for the cabinet can usually cool only one chamber. Different chambers need to be equipped with different heat exchange modules. Consequently, flexibility is poor and costs are high.

SUMMARY

The embodiments may provide a heat exchange module and a cabinet, to cool different chambers of a cabinet body, and reduce a quantity of heat exchange modules that are equipped.

According to a first aspect, a heat exchange module is provided. The heat exchange module is used in a cabinet. The cabinet includes a cabinet body, the cabinet body has a first space and a second space, a temperature of the first space is higher than a temperature of the second space, the heat exchange module has a first air circulation system and a second air circulation system, and heat exchange may be performed between the first air circulation system and the second air circulation system; both an air intake vent and an air exhaust vent of the first air circulation system are configured to be connected to the first space; and an air exhaust vent of the second air circulation system is connected to an external space, and an air intake vent of the second air circulation system may be configured to be selectively connected to the external space and/or the second space. When the second space shares the heat exchange module with the first space, the air intake vent of the second air circulation system is connected to the second space, air in the first air circulation system is cooled by using air in the second space, hot air in the second space is continuously discharged to the external space, and the second space is continuously filled with low-temperature air from the external space through the air intake vent, thereby simultaneously cooling the first space and the second space. When the second space does not need to share the heat exchange module with the first space due to reasons such as a separate heat dissipation apparatus is equipped for the second space, the air intake vent of the second air circulation system is connected to the external space, and air in the first air circulation system is cooled by using air that comes from the external space and that has a lower temperature than that of the second space, to implement higher cooling efficiency. In addition, when the air intake vent of the second air circulation system is simultaneously connected to the external space and the second space, cooling efficiency of the first space and the second space may be taken into consideration.

The second air circulation system may be in a plurality of forms. The second air circulation system may include an air supply assembly, a first air intake structure, a second air intake structure, and an air exhaust structure, and the air supply assembly includes at least one air supply component; an air exhaust vent of each air supply component is connected to the external space through the air exhaust structure; and an air intake vent of each air supply component may be selectively connected to the external space through the first air intake structure or connected to the second space through the second air intake structure.

The air intake vent of each air supply component may be selectively connected to the external space or the second space in a plurality of forms. When each air supply component is in a first state, the air intake vent of the air supply component may be connected to an air exhaust vent of the first air intake structure; and when each air supply component is in a second state, the air intake vent of the air supply component may be connected to an air exhaust vent of the second air intake structure.

The air exhaust vent of the first air intake structure may be disposed opposite to the air exhaust vent of the second air intake structure, and each air supply component may be located between the air exhaust vent of the first air intake structure and the air exhaust vent of the second air intake structure; when the air supply component is in the first state, the air intake vent of the air supply component is disposed opposite to the air exhaust vent of the first air intake structure; and when the air supply component is in the second state, the air intake vent of the air supply component is disposed opposite to the air exhaust vent of the second air intake structure. The air intake vent of the air supply component can be selectively connected to the second space or the external space by only flipping the air supply component.

An air intake vent of the air exhaust structure and the air exhaust vent of the air supply component may be connected in a plurality of manners, for example, may be connected through a hose. In addition, an air intake direction of each air supply component is perpendicular to an air exhaust direction; the air intake vent of the air exhaust structure is disposed opposite to a gap between the air exhaust vent of the first air intake structure and the air exhaust vent of the second air intake structure; and regardless of whether each air supply component is in the first state or the second state, the air exhaust vent of the air supply component is disposed opposite to the air intake vent of the air exhaust structure. Compared with the connection implemented through the hose, a structure of the second air circulation system may be simplified in this solution.

The air exhaust vent of the first air intake structure and the air exhaust vent of the second air intake structure may be disposed side by side with a same orientation; and each air supply component may slide in an arrangement direction of the air exhaust vent of the first air intake structure and the air exhaust vent of the second air intake structure. The air supply component slides in a straight-line direction, to complete switching between a connection of the air intake vent of the air supply component and the air exhaust vent of the first air intake structure and a connection of the air intake vent of the air supply component and the air exhaust vent of the second air intake structure.

For example, each air supply component may be a centrifugal fan.

In addition to the form of switching between the connection of the air intake vent of the air supply component and the air exhaust vent of the first air intake structure and the connection of the air intake vent of the air supply component and the air exhaust vent of the second air intake structure, the second air circulation system may alternatively be in the following form: both an air exhaust vent of the first air intake structure and an air exhaust vent of the second air intake structure may be connected to the air intake vent of each air supply component; and a first switch configured to control open and close of the first air intake structure is disposed on the first air intake structure, and a second switch configured to control open and close of the second air intake structure is disposed on the second air intake structure. The first switch and the second switch are separately controlled, so that each air supply component can obtain air from the external space, the second space, or both the second space and the external space.

The second air circulation system may further include a third air intake structure, an air intake vent of the third air intake structure is configured to be connected to the second space, and an air exhaust vent of the third air intake structure is connected to the air exhaust vent of the first air intake structure. When the air intake vent of the air supply component is connected to the air exhaust vent of the first air intake structure, the air supply component may simultaneously obtain air from the external space and the second space, and heat dissipation of each air supply component for the first space and the second space are taken into consideration.

Because the second space usually has a low requirement for heat dissipation, an air volume of the third air intake structure may be less than an air volume of the first air intake structure.

According to a second aspect, the embodiments may further provide a cabinet. The cabinet includes a cabinet body and the heat exchange module, where the cabinet body may have a first space and a second space; both an air intake vent and an air exhaust vent of a first air circulation system are connected to the first space; and an air intake vent of a second air circulation system may be selectively connected to an external space and/or the second space.

When the second space shares the heat exchange module with the first space, the air intake vent of the second air circulation system is connected to the second space, air in the first air circulation system is cooled by using air in the second space, hot air in the second space is continuously discharged to the external space, and the second space is continuously filled with low-temperature air from the external space through the air intake vent, thereby simultaneously cooling the first space and the second space. When the second space does not need to share the heat exchange module with the first space due to reasons such as a separate heat dissipation apparatus is equipped for the second space, the air intake vent of the second air circulation system is connected to the external space, and air in the first air circulation system is cooled by using air that comes from the external space and that has a lower temperature than that of the second space, to implement higher cooling efficiency. In addition, when the air intake vent of the second air circulation system is simultaneously connected to the external space and the second space, cooling efficiency of the first space and the second space may be taken into consideration.

DETAILED DESCRIPTION OF THE EMBODIMENTS

To make objectives, solutions, and advantages clearer, the following further describes the embodiments in detail with reference to the accompanying drawings.

To facilitate understanding of a cabinet provided in the embodiments, an application scenario of the cabinet is first described. The cabinet may be an indoor cabinet or outdoor cabinet. Regardless of the indoor cabinet or outdoor cabinet, the cabinet has a first space and a second space. In addition, when the cabinet is put into use, a heat emitting power of a device in the first space is greater than a heat emitting power of a device in the second space. In this case, an air temperature in the first space is higher than an air temperature in the second space. Herein, both the first space and the second space may be independent chambers. For example, when the cabinet is put into use, a communication device that emits a large amount of heat, for example, a base station, is disposed in the first space, and an apparatus that emits a small amount of heat, for example, a battery, is disposed in the second space.

Figure 1:
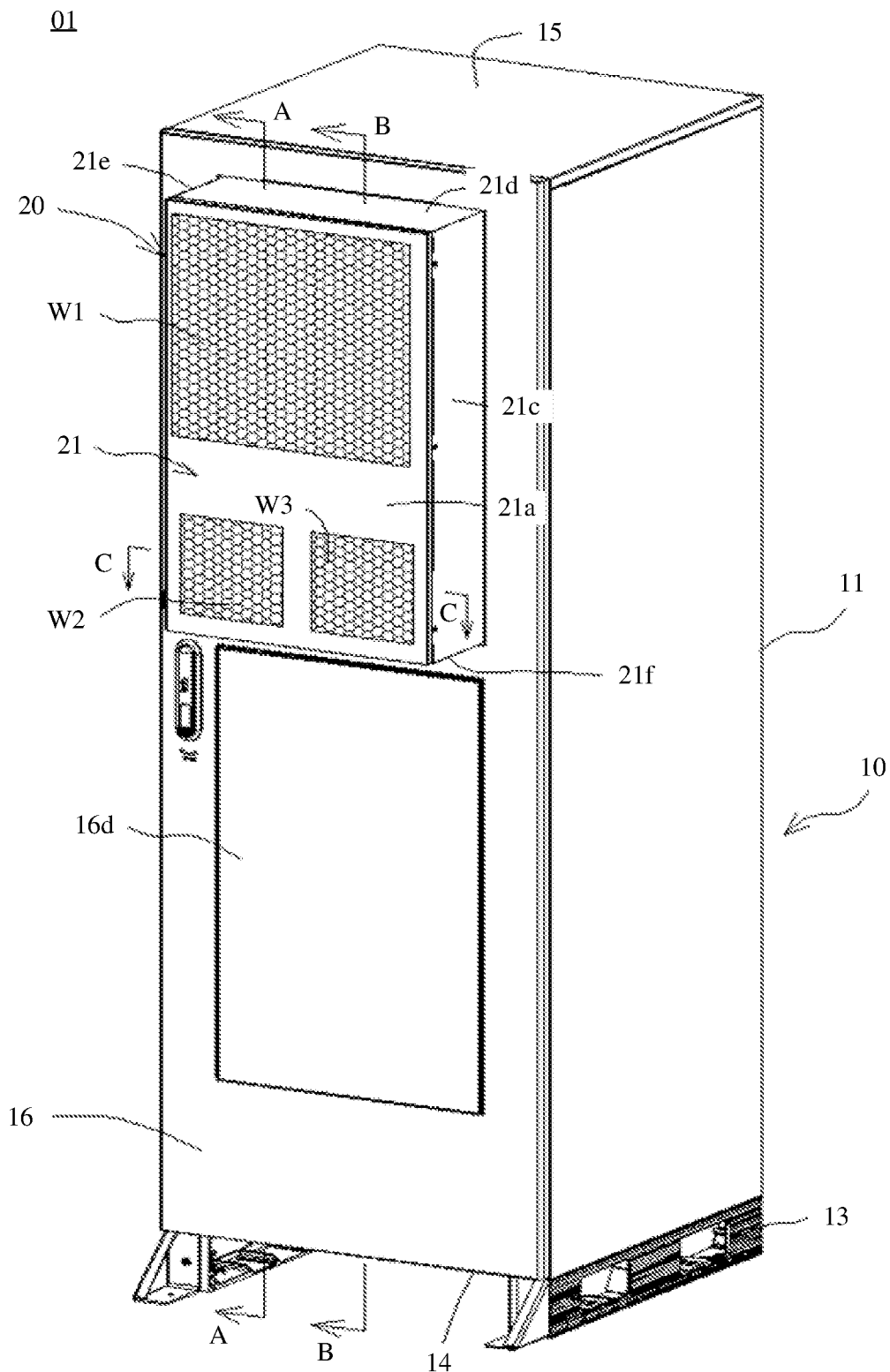
FIG. 1 is a three-dimensional diagram of an example of a cabinet according to an embodiment.
Figure 2:
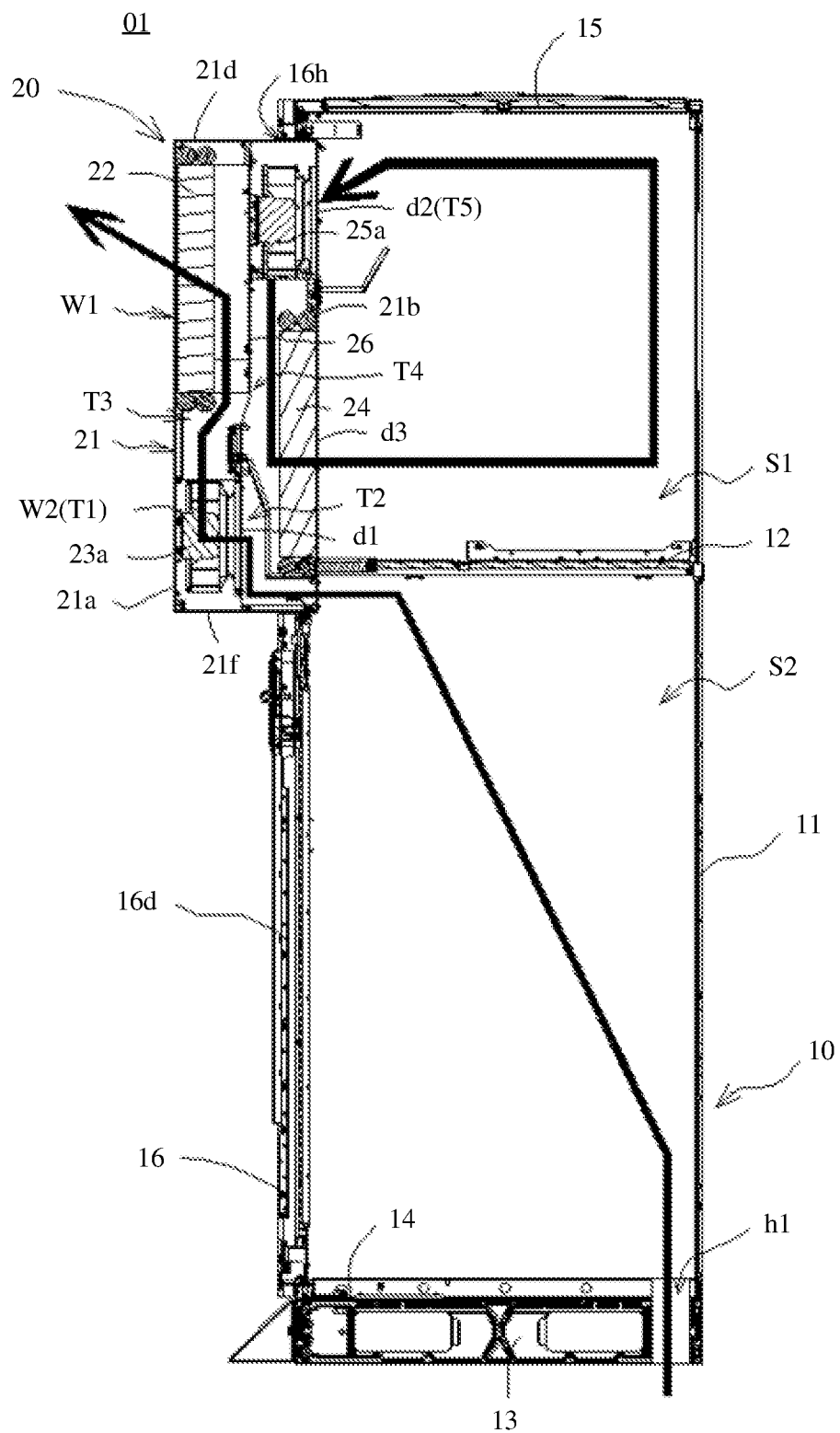
FIG. 2 is a section view of the cabinet in a direction A-A in FIG. 1.

FIG. 1 is a three-dimensional diagram of an example of a cabinet according to an embodiment; and FIG. 2 is a section view of the cabinet in FIG. 1 in a direction A-A. For example, the cabinet 01 includes a cabinet body 10 and a heat exchange module 20. The cabinet body 10 includes an enclosure wall 11, a cabinet door 16, a top wall 15, a bottom wall 14, and a first partition wall 12. The enclosure wall 11 is formed by three side walls that are sequentially connected and perpendicular to each other. The top wall 15 is disposed at an opening on a top side of the enclosure wall 11. The bottom wall 14 is disposed at an opening on a bottom side of the enclosure wall 11. The cabinet door 16 is hinged to an edge of one side wall of the enclosure wall 11 by using a hinge. The enclosure wall 11, the top wall 15, the bottom wall 14, and the cabinet door 16 enclose a closed space. The first partition wall 12 is disposed on an inner side of a middle part of the enclosure wall 11, and is basically parallel to the bottom wall 14, to divide the closed space into a first space S1 and a second space S2. The first space S1 may be configured to mount a device that emits a large amount of heat, for example, a base station. The second space S2 may be configured to mount an apparatus that emits a small amount of heat, for example, a battery. A base 13 that supports the bottom wall 14 and raises the bottom wall 14 above the ground is disposed below the bottom wall 14 of a chamber in which the second space S2 is located. In addition, the bottom wall 14 has an air intake vent h1, and the bottom wall 14 is raised above the ground, to prevent the air intake vent h1 from being blocked by the ground. This facilitates air intake and prevents rain from entering the chamber with air. However, it should be understood that this disposition manner of the air intake vent h1 of the cabinet body 10 is merely an example. The air intake vent of the cabinet body 10 may alternatively be disposed at a bottom or bottoms of any one or more of the side walls of the enclosure wall 11. Therefore, air entering the air intake vent may also flow through a large part of space in the second space S2 to reach an upper part of the second space S2 and enter the heat exchange module 20.

Figure 3:
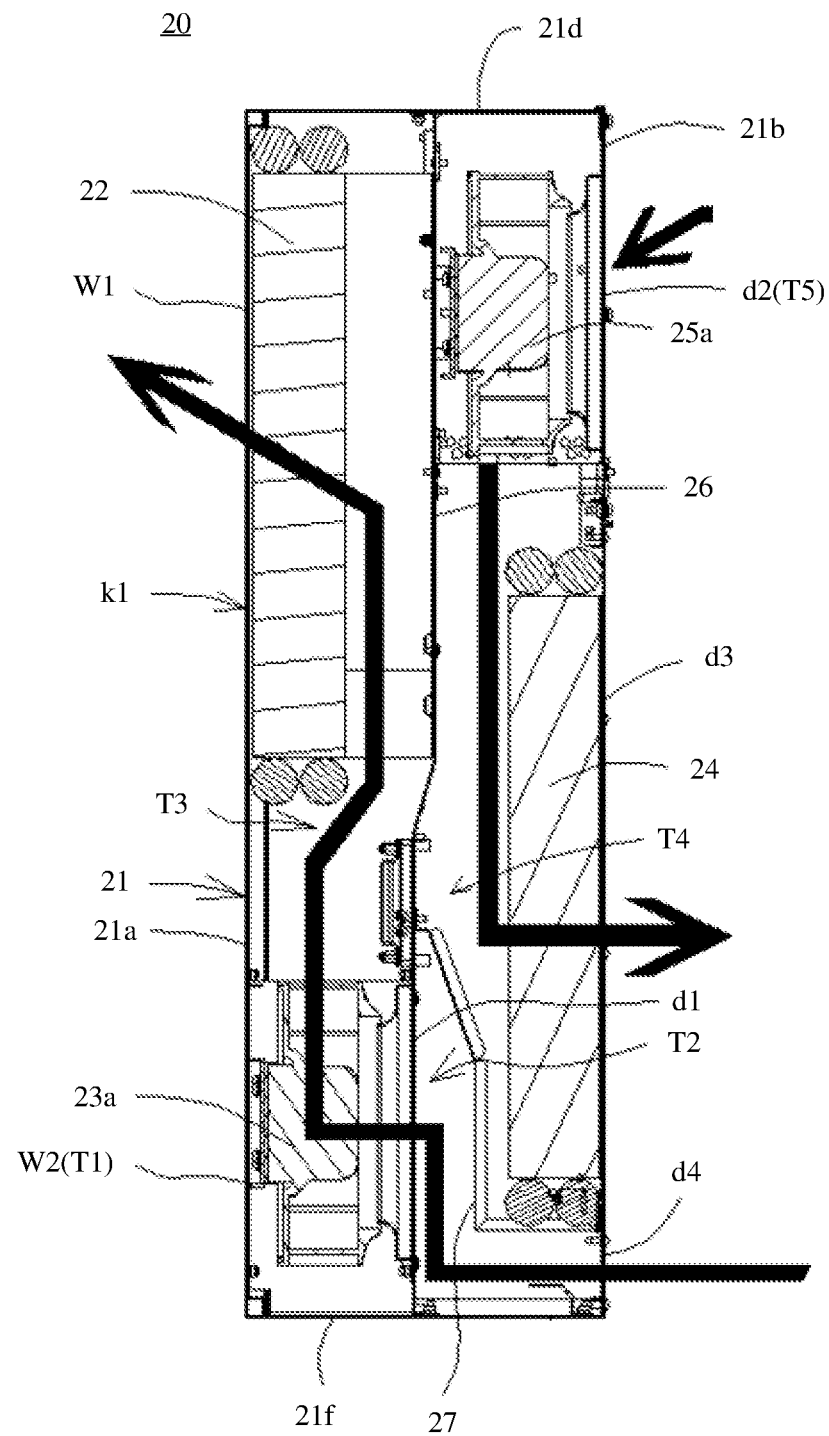
FIG. 3 is an enlarged section view of a heat exchange module 20 in FIG. 2.

FIG. 3 is an enlarged section view of the heat exchange module 20 in FIG. 2. For example, the heat exchange module 20 has a cubic housing 21, and the housing 21 has a first side wall 21a and a second side wall 21b that are disposed opposite to each other, and connection walls (21c, 21d, 21e, and 21f) that connect the first side wall 21a and the second side wall 21b. A hollow-out structure 16h (FIG. 2) is disposed on an upper part of the cabinet door 16, and the housing 21 is inserted in the hollow-out structure 16h. The connection walls (21c, 21d, 21e, and 21f) are respectively attached and fastened to four side edges of the hollow-out structure 16h in a one-to-one correspondence. The first side wall 21a faces an external space, and the second side wall 21b faces one side wall of the enclosure wall 11, to embed the housing 21 in the cabinet door 16. A first partition wall 26 is further disposed in the housing 21, and an edge of the first partition wall 26 is separately connected to middle parts of the connection walls (21c, 21d, 21e, and 21f), to divide a space in the housing 21 into two independent subspaces.

Still refer to FIG. 2 and FIG. 3. A condenser 22 and an air supply component 23a are disposed in a subspace between the first partition wall 26 and the first side wall 21a. An upper part of the first side wall 21a has a first window W1, and the first window W1 is covered by a protective net to prevent the air supply component 23a from hurting people or prevent external impurities from entering. The condenser 22 is disposed on an inner side of the protective net of the first window W1, is disposed opposite to the first window W1, and is connected to the first side wall 21a. The first side wall 21a further has a second window W2. The second window W2 is located on a lower side of the first window W1 and is covered by a protective net. The air supply component 23a is located on an inner side of the second window W2, is disposed opposite to the second window W1, and may be fastened to the first partition wall 26 (for example, by using a bolt). The air supply component 23a may be a centrifugal fan or another component that has an air flow driving function and whose air intake direction is perpendicular to air exhaust direction. In FIG. 1 to FIG. 3, for example, the air supply component 23a uses a centrifugal fan. The second window W2 may be considered as an air duct T1 that can supply air to the air supply component 23a. The second window W2 may be a through hole provided on the first side wall 21a and an inner wall of the through hole may enclose the air duct T1. A length of the air duct T1 is a wall thickness of the first side wall 21a. However, this is merely an example of the air duct T1, and the air duct T1 may alternatively be in another form. For example, the air duct T1 is formed by a lengthened pipeline. A related variant is described later. An air exhaust vent of the air supply component 23a faces the connection wall 21d, an air duct T3 may be formed between the air exhaust vent of the air supply component 23a and the first window W1 or an air intake vent of an air duct T3 is disposed opposite to the air exhaust vent of the air supply component 23a, and the first window W1 is used as an air exhaust vent of the air duct T3. An air vent d1 is disposed at a position that is on the first partition wall 26 and that is opposite to the second window W2, and an air intake vent of the air supply component 23a is disposed opposite to the air vent d1.

Still refer to FIG. 2 and FIG. 3. An evaporator 24 and an air flow driving component 25a are disposed in a subspace between the second side wall 21b and the first partition wall 26. For a form of the air flow driving component 25a, refer to the form of the air supply component 23a, for example, the air flow driving component 25a may be a centrifugal fan. An air vent d2 is disposed on an upper part of the second side wall 21b, the air flow driving component 25a is fastened to the second side wall 21b, and an air intake vent of the air flow driving component 25a is disposed opposite to the air vent d2. Similar to the second window W2, the air vent d2 also forms an air duct T5, that is, the air intake vent of the air flow driving component 25a is disposed opposite to an air exhaust vent of the air duct T5. An air vent d3 is further disposed at a lower part of the second side wall 21b, the air vent d3 is located on a lower side of the air vent d2, and the evaporator 24 is fastened to the second side wall 21b and is disposed opposite to the air vent d3. An air vent d4 is further disposed on the second side wall 21b, the air vent d4 is located between the air vent d3 and the connection wall 21f, and a second partition wall 27 is further connected between the first partition wall 26 and the second side wall 21b. The second partition wall 27 extends from a position of one side that is of the air vent d1 of the first partition wall 26 and that is away from the connection wall 21f to a position between the air vent d4 and the evaporator 24, to isolate the subspace between the first partition wall 26 and the second side wall 21b into an air duct T2 and an air duct T4. An air intake vent of the air duct T2 is connected to the second space S2 through the air vent d4, and an air exhaust vent of the air duct T2 is disposed opposite to an air exhaust vent of the air duct T1 and is connected to the air intake vent of the air supply component 23a through the air vent d1. The air duct T4 connects an air exhaust vent of the air flow driving component 25a and the air vent d3. The condenser 22 is connected to the evaporator 24 through a pipeline, to perform liquid circulation heat exchange.

The following describes, with reference to FIG. 2 and FIG. 3, a process in which the heat exchange module 20 dissipates heat from the first space S1 and the second space S2.

After the air flow driving component 25a is started, air heated by heat emitted by a communication device, for example, a base station, in the first space S1 is driven by the air flow driving component 25a to form an air flow. The air flow enters the air intake vent of the air flow driving component 25a through the air duct T5, is blown out to the air duct T4 through the air exhaust vent of the air flow driving component 25a and contacts the evaporator 24 for heat exchange. In this case, heat is transferred to the evaporator 24, and the air flow is cooled. Then the air flow returns to the first space S1 through the air vent d4, and a temperature in the first space S1 is reduced. For a rough path of the air flow, refer to arrows that pass through the air flow driving component 25a in FIG. 2 and FIG. 3. However, it should be understood that the arrows are merely used to schematically describe a circulation trend of the air flow. An actual air flow situation is complex, for example, a turbulent flow phenomenon is generated, and the air flow is further affected by an internal structure of the first space S1 and undergoes different deformation. An air flow path represented by arrows in the following is similar. Details are not described herein again. For example, the air duct T5, the air flow driving component 25a, and the air duct T4 form a part of the first air circulation system.

After the air supply component 23a is started, air in the second space S2 reaches the air intake vent of the air supply component 23a through the air vent d4, the air duct T2, and the air vent d1. Driven by the air supply component 23a, the air is output by the air exhaust vent of the air supply component 23a to the air duct T3 and passes through the condenser 22. Because a temperature of the air in the second space S2 is lower than a temperature in the first space S1, a temperature of liquid in the condenser 22 is higher than the temperature of the air flowing out from the second space S2. Therefore, the air flowing out from the second space S2 cools the condenser 22, carries heat in the condenser 22, and is output to the external space through the first window W1. In the foregoing process, heat of the first space S1 is absorbed by the evaporator 24 and transferred to the condenser 22. The heat in the condenser 22 is carried to the external space by the air from the second space S2. In addition, when the second space S2 does not require heat dissipation or has a low requirement for heat dissipation, the air supply component 23a may be flipped by 180°. In this case, the air exhaust vent of the air supply component 23a is still connected to an air intake vent of the air duct T3, but the air intake vent of the air supply component 23a is disposed opposite to the air exhaust vent of the air duct T1. In this case, the air supply component 23a is in a first state, and air is not obtained from the second space S2 through the air duct T2, but air is directly obtained from the external space through the air duct T1. Because a temperature of the air from the external space is lower than a temperature in the second space S2, a cooling effect on the condenser 22 is better. For a form obtained after the air supply component 23a is flipped by 180°, refer to an air supply component 23b in FIG. 4 and FIG. 5. Correspondingly, when the air intake vent of the air supply component 23a is opposite to the air exhaust vent of the air duct T2, the air supply component 23a is in a second state. For example, the air duct T1, the air duct T2, the air supply component 23a, and the air duct T3 form a part of the second air circulation system.

Figure 4:
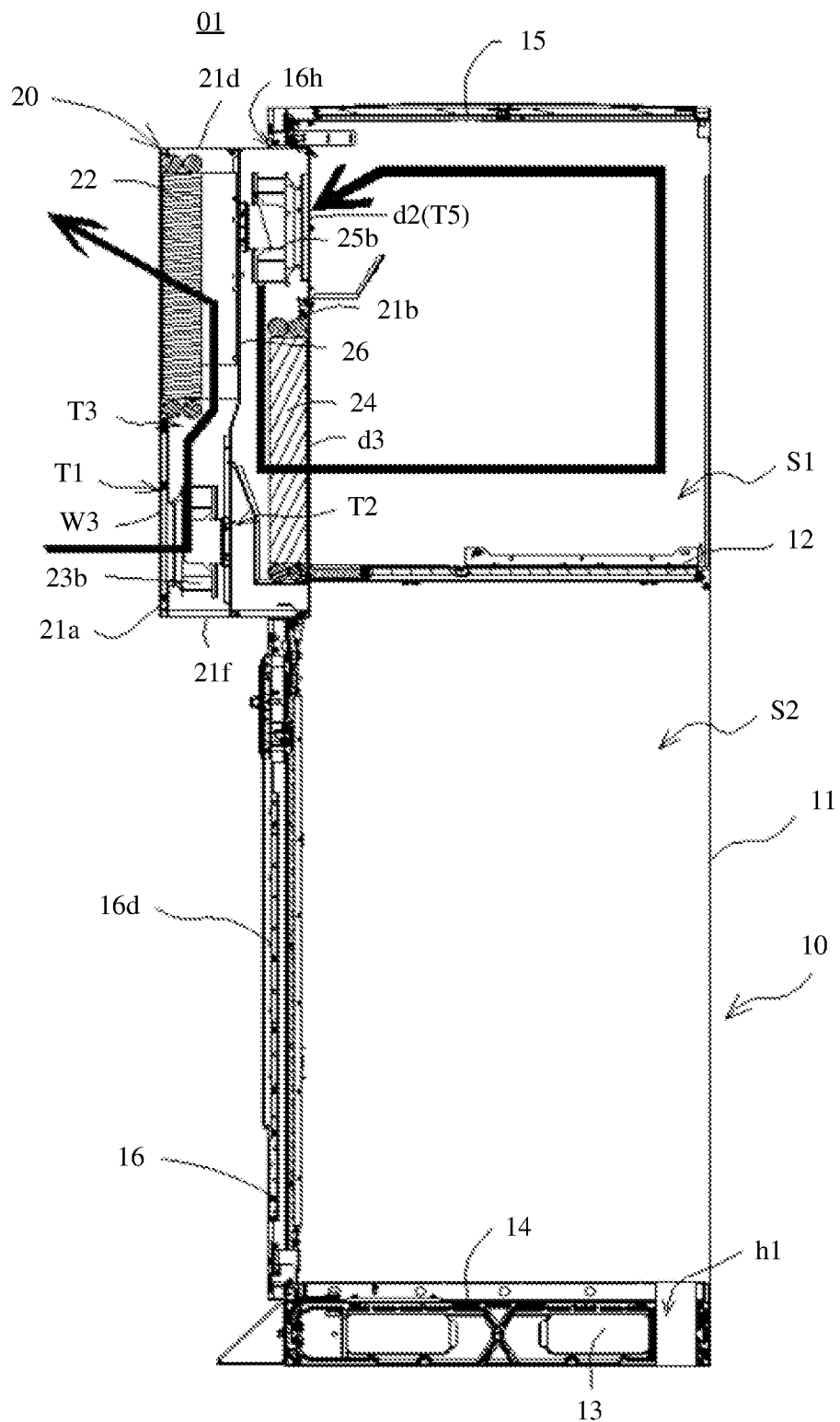
FIG. 4 is a section view of the cabinet in a direction B-B in FIG. 1.
Figure 5:
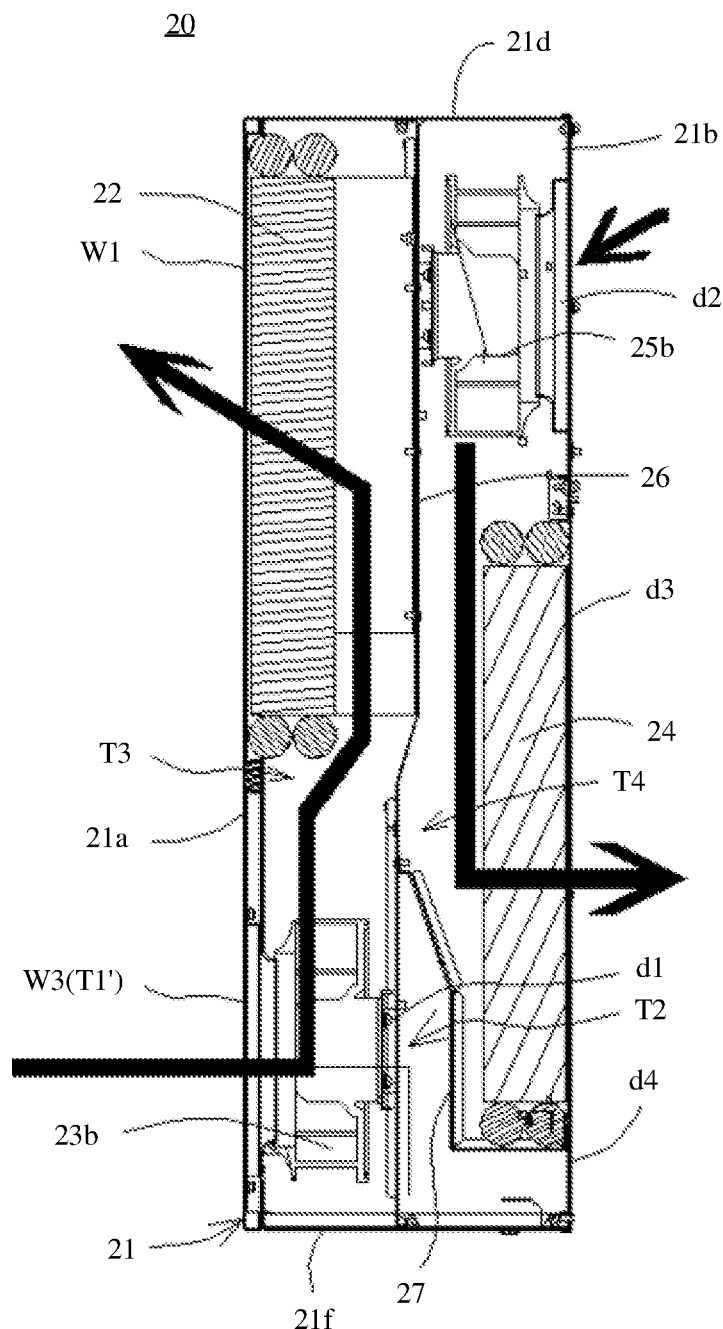
FIG. 5 is an enlarged section view of the heat exchange module 20 in FIG. 3.

FIG. 4 is a section view of the cabinet in FIG. 1 in a direction B-B; and FIG. 5 is an enlarged section view of the heat exchange module 20 in FIG. 3. Refer to FIG. 4 and FIG. 5. An only difference between FIG. 5 and FIG. 3 is as follows: The air flow driving component 25a is replaced with an air flow driving component 25b, where a structure and a mounting manner of the air flow driving component 25b are the same as those of the air flow driving component 25a; and the air supply component 23a is replaced with an air supply component 23b, and the second window W2 is replaced with a third window W3 (or similar to the air duct T1, denoted as an air duct T1'), where a difference between the air supply component 23b and the air supply component 23a lies only in a mounting manner, for example, an air exhaust vent of the air supply component 23b is connected to the external space through the air duct T3, and an air intake vent of the air supply component 23b obtains air from the external space through the air duct T1', which is similar to the foregoing situation in which the air intake vent of the air supply component 23a is connected to the air exhaust vent of the air duct T1. However, the air supply component 23b may alternatively be flipped by 180° to obtain air from the second space S2. However, compared with obtaining the air from the second space S2, the air supply component 23b can more effectively cool air in the first space S1 by directly obtaining air from the external space.

In FIG. 3 and FIG. 5, the air duct T1 and the air duct T1' are two independent structures. This is merely an example. Alternatively, the air duct T1 and the air duct T1' may be replaced with one air duct to simultaneously supply air to the air supply component 23a and the air supply component 23b, or the air duct T1 and the air duct T1' are replaced with a structure having one air intake vent and a plurality of air exhaust vents or a structure having a plurality of air intake vents and one air exhaust vent, provided that air can be supplied to the air intake vent of the air supply component 23a and the air intake vent of the air supply component 23b. The foregoing structures each may be referred to as a first air intake structure. Similarly, the air supply component 23a and the air supply component 23b share the same air duct T3 for air exhaust. This is also merely an example. The air duct T4 may be isolated by a partition board into two air sub-ducts that are respectively connected to the air exhaust vent of the air supply component 23a and the air exhaust vent of the air supply component 23b, or a structure that has a plurality of air exhaust vents and one air intake vent simultaneously connected to the air exhaust vents of the air supply component 23a and the air supply component 23b or a structure that has a plurality of air intake vents and one air exhaust vent is used. The air duct T4 and various substitutive forms of the air duct T4 each may be referred to as an air exhaust structure of an air supply assembly, and a form of the air exhaust structure is also not limited to the foregoing forms, provided that air can be obtained through the air exhaust vent of the air supply component 23a and the air exhaust vent of the air supply component 23b, and the air can be discharged to the external space. Similarly, the air supply component 23a and the air supply component 23b share the same air duct T2. However, this is merely an example. For example, the air duct T2 may be divided by a partition board into two air sub-ducts that are respectively connected to the air supply component 23a and the air supply component 23b, or a structure that has one air intake vent connected to the second space S2 and two air exhaust vents respectively connected to the air intake vent of the air supply component 23a and the air intake vent of the air supply component 23b or a structure that has a plurality of air intake vents and one air exhaust vent is used. The air duct T2 and various substitutive forms of the air duct T2 each may be referred to as a second air intake structure, and a form of the second air intake structure is also not limited to the foregoing forms, provided that air can be obtained from the second space S2, and the air can be supplied to the air intake vent of the air supply component 23a and the air intake vent of the air supply component 23b.

The air flow driving component 25a and the air flow driving component 25b form an air flow driving assembly. For example, the air duct T5, the air flow driving assembly, and the air duct T4 form the first air circulation system. The first circulation system can suck out the air in the first space S1 to the heat exchange module 20, use a component that can cool the air, for example, the evaporator 24, to cool the air sucked out of the first space S1, and then send cooled air to the first space S1. In this way, the air in the first space S1 is circulated once.

Figure 6:
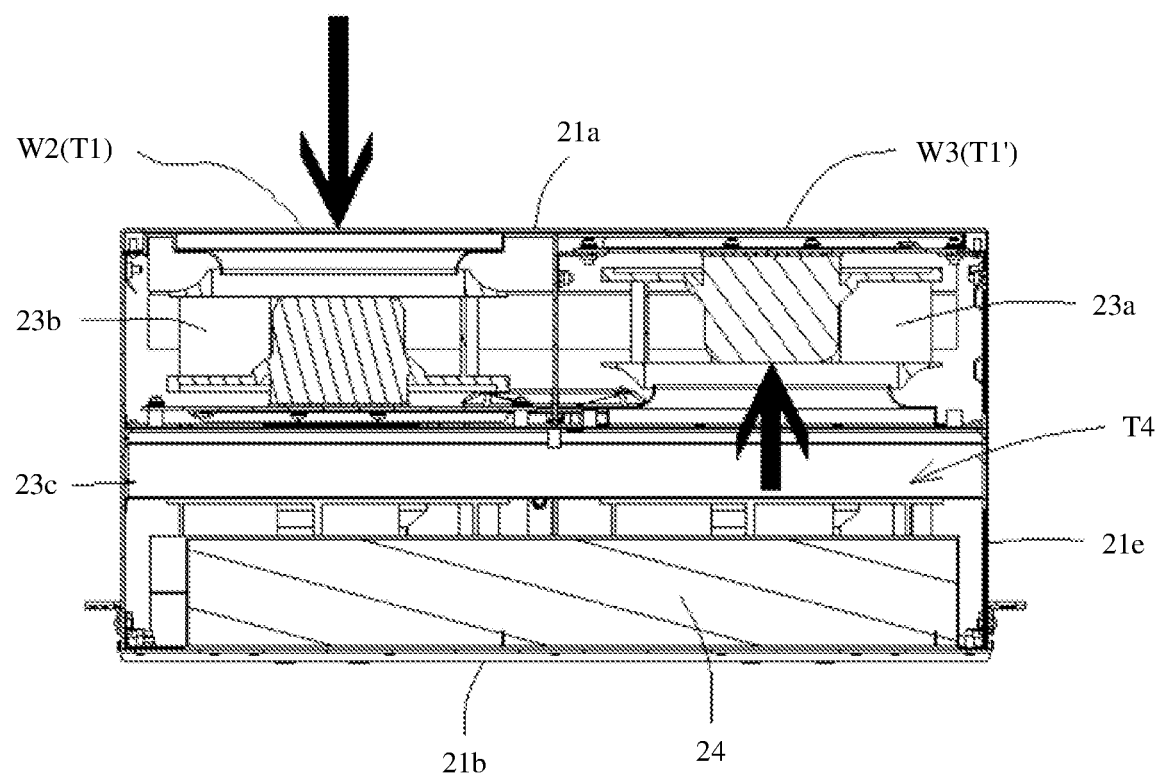
FIG. 6 is a section view of the cabinet in a direction C-C in FIG. 1.

In addition, the air supply component 23a and the air supply component 23b form the air supply assembly. That the air supply assembly includes two air supply components (23a and 23b) is merely an example. The air supply assembly may alternatively include one or more than three air supply components. For a mounting manner of each air supply component, refer to the air supply component 23a and the air supply component 23b. By adjusting an orientation of the air intake vent of each air supply component, the second air circulation system may selectively obtain air from the second space S2 and/or the external space. For example, when a heat dissipation apparatus is separately mounted for the second space S2 (for details, refer to FIG. 1, an auxiliary mounting door 16d on the cabinet door 16 is removed to form an exhaust window, and an air conditioner is mounted at a position of the exhaust window to cool the second space S2), both the air supply component 23a and the air supply component 23b do not need to dissipate heat from the second space S2, and air is directly obtained from the external space. When the second space S2 emits a large amount of heat, both the air intake vents of the air supply component 23a and the air supply component 23b are connected to the second space S2, to improve heat dissipation efficiency of the second space S2. FIG. 6 is a section view of FIG. 1 in a direction C-C. When both the first space S1 and the second space S2 require heat dissipation, one of the air supply component 23a and the air supply component 23b may obtain air from the external space, and the other of the air supply component 23a and the air supply component 23b may obtain air from the second space S2. In this way, heat dissipation of the first space S1 and heat dissipation of the second space S2 are taken into consideration. When the air supply assembly includes more than three air supply components, a proportion of air supply components that obtain air from the external space and a proportion of air supply components that obtain air from the second space S2 may be further determined based on heat dissipation requirements of the first space S1 and the second space S2. For example, when the first space S1 requires better heat dissipation, more air supply components are used to obtain air from the external space; and when the second space S2 requires better heat dissipation, more air supply components are used to obtain air from the second space S2.

In the embodiments corresponding to FIG. 1 to FIG. 6, the first air circulation system and the second air circulation system exchange heat by using the interconnected evaporator 24 and condenser 22. This is merely an example. Heat exchange may alternatively be implemented in another manner, for example, by using a surface type heat exchanger.

Figure 7:
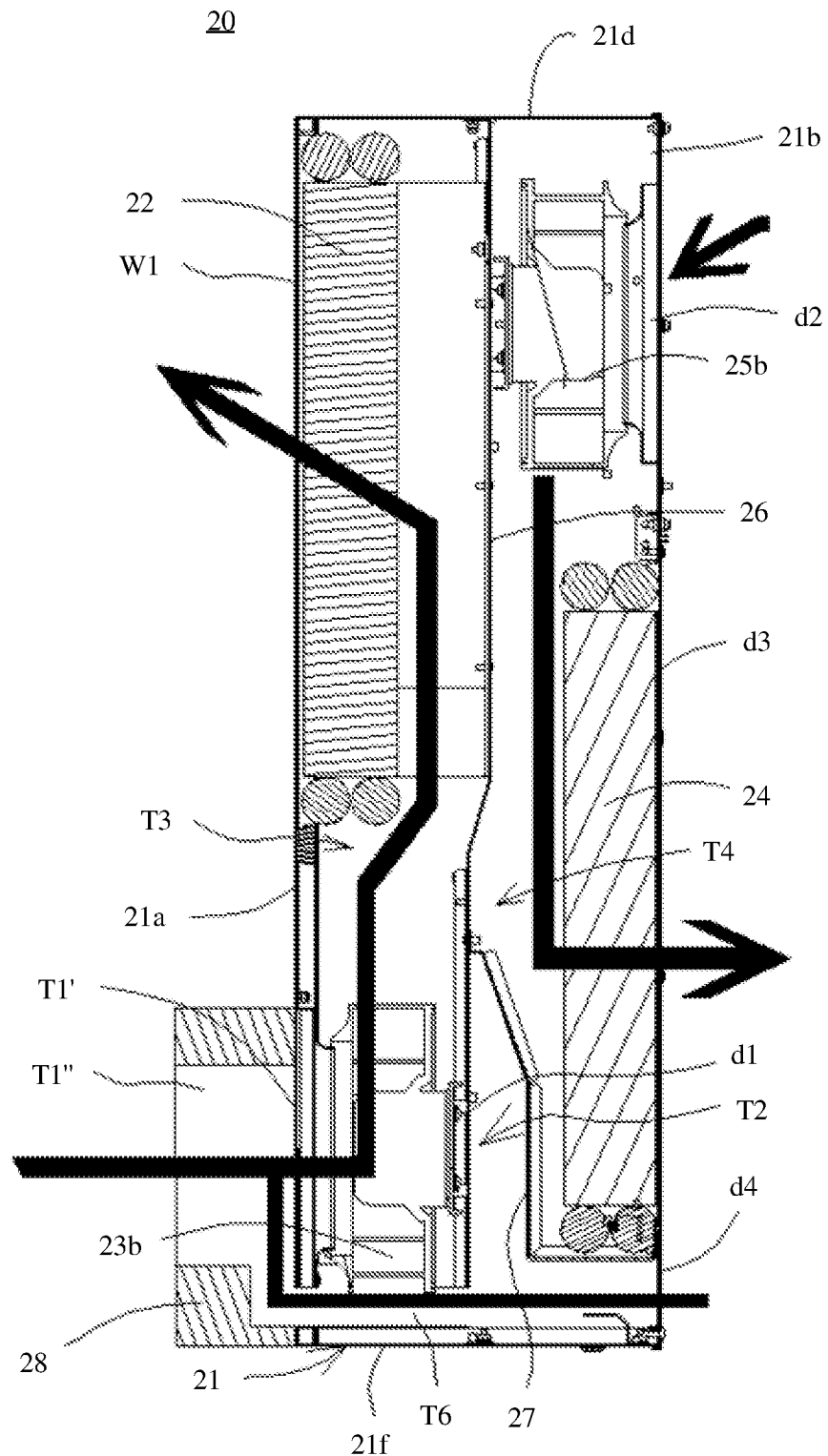
FIG. 7 shows a variant of a heat exchange module 20 shown in FIG. 6.

FIG. 7 shows a variant of the heat exchange module 20 shown in FIG. 6. Refer to FIG. 7. A difference between FIG. 7 and FIG. 6 is as follows: An auxiliary air intake structure 28 is added. The auxiliary air intake structure 28 is mounted on the first side wall 21a. As a part of the first air intake structure, an air duct T1" sequentially penetrates through the auxiliary air intake structure 28 and the first side wall 21a, to connect the air intake vent of the air supply component 23b and the external space. In addition, an air duct T6 is further added. The air duct T6 sequentially passes, from the air vent d4, through a gap between the air supply component 23b and the connection wall 21f and through the auxiliary air intake structure 28 and is connected to an air exhaust vent of the air duct T1". The air duct T6 and the air duct T2 share one air intake vent (the air vent d4) or may separately have one air intake vent connected to the second space S2. When the air intake vent of the air supply component 23b is connected to the air duct T1", the air supply component 23b simultaneously obtains air from the second space S2 through the air duct T6. In this way, cooling efficiency of the first space S1 and heat dissipation of the second space S2 are taken into consideration. In addition, because the second space S2 has a low requirement for heat dissipation, an air volume of the air duct T6 is less than an air volume of any one of the air duct T1" and the air duct T1'. The "air volume" herein refers to a volume of air passing through a cross section in a unit time. For example, an area of a minimum cross section of the air duct T6 may be less than an area of a minimum cross section of the air duct T1". However, the foregoing form of connecting the air exhaust vent of the air duct T6 and the air duct T1" by mounting the auxiliary air intake structure 28 is merely an example. Another form may alternatively be used, provided that a third air intake structure can be used to connect the second space S2 and the air exhaust vent of the first air intake structure, and an air volume of the third air intake structure can be less than an air volume of the first air intake structure.

In the embodiments corresponding to FIG. 1 to FIG. 7, the air supply components (23a and 23b) obtain air from the external space or the second space S2 by flipping the air supply components (23a and 23b). However, this is merely an example. Another form may alternatively be used, provided that when the air supply component in the second air circulation system is in the first state, the air intake vent of the air supply component can be connected to the air exhaust vent of the first air intake structure and can obtain air from the external space through the first air intake structure, and when the air supply component is in the second state, the air intake vent of the air supply component is connected to the air exhaust vent of the second air intake structure and obtains air from the second space through the second air intake structure. In some other situations, the air exhaust vent of the third air intake structure may alternatively be connected to the air exhaust vent of the first air intake structure, and when the first air intake structure is used to obtain air from the external space, the third air intake structure is used to obtain air from the second space S2 at the same time. For example, the second air circulation system may alternatively be in the following form.

Figure 8:
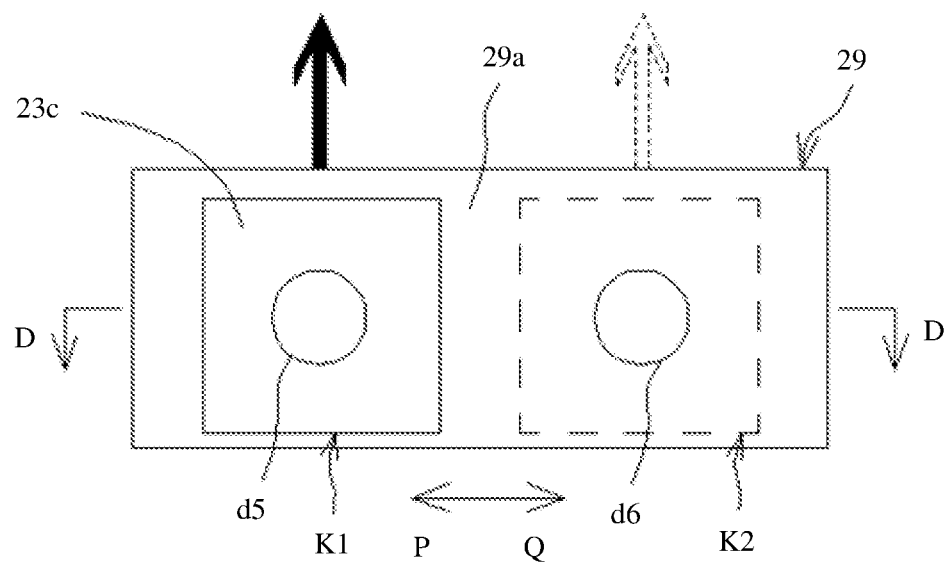
FIG. 8 is a schematic diagram of a local structure of another second air circulation system in a cabinet according to an embodiment.
Figure 9:
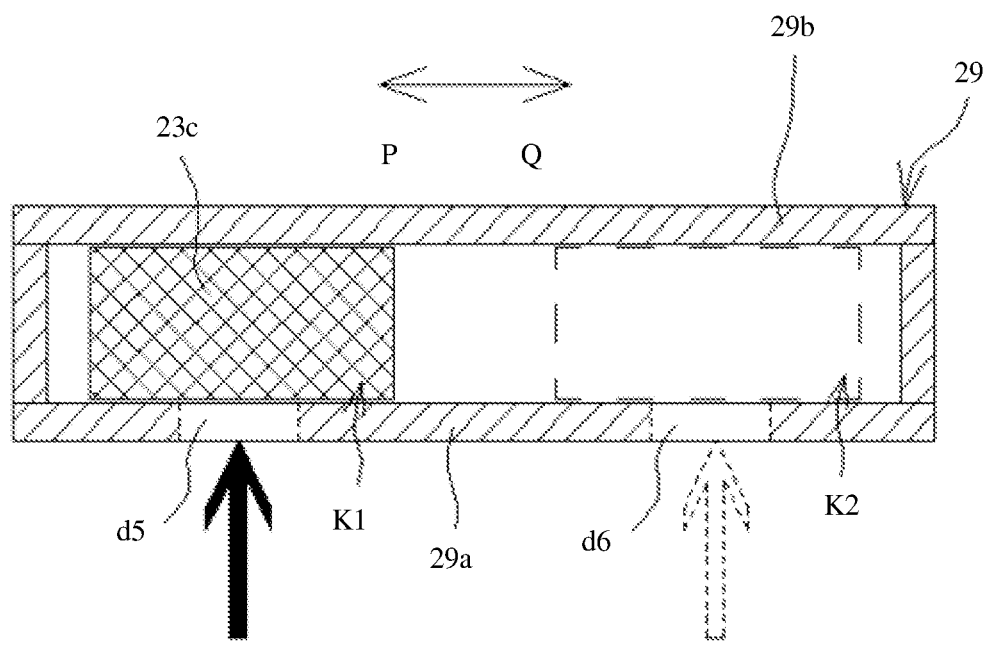
FIG. 9 is a section view of FIG. 8 in a direction D-D.

FIG. 8 is a schematic diagram of a local structure of another second air circulation system in a cabinet according to an embodiment; and FIG. 9 is a section view of FIG. 8 in a direction D-D. The second air circulation system includes a limiting housing 29, an air supply component 23c, a first air intake structure, a second air intake structure, and an air exhaust structure. The limiting housing 29 has a first limiting wall 29a and a second limiting wall 29b that are disposed opposite to each other. For a type selection of the air supply component 23c, refer to the same structure of the foregoing air supply component 23a, for example, a centrifugal fan is selected. The air supply component 23c is disposed between the first limiting wall 29a and the second limiting wall 29b and may be switched between a first position K1 and a second position K2 in a direction PQ. An air intake vent of the air supply component 23c faces the first limiting wall 29a. The first limiting wall 29a has an air vent d5 and an air vent d6 that are distributed side by side in the direction PQ. The air vent d5 is connected to the external space through the first air intake structure, and the air vent d6 is connected to the second space of the cabinet body through the second air intake structure. When the air supply component 23c is in the first position K1 (also referred to as that the air supply component 23c is in the first state), the air intake vent of the air supply component 23c is disposed opposite to and connected to the air vent d5. When the air supply component 23c is in the second position K2 (also referred to as that the air supply component 23c is in the second state), the air intake vent of the air supply component 23c is disposed opposite to and connected to the air vent d6. In this way, the air intake vent of the second air circulation system can be selectively connected to the external space or the second space of the cabinet body. A top part of the limiting housing 29 has an air exhaust vent, the air exhaust vent at the top part of the limiting housing is connected to the external space through the air exhaust structure, and the air exhaust structure exchanges heat with the first air circulation system by using a heat exchange structure. A difference between the embodiment corresponding to FIG. 8 and the embodiments corresponding to FIG. 1 to FIG. 7 is as follows: Switching of the air intake vent of the second air circulation system between the external space and the second space by flipping the air supply component is replaced with switching of the air intake vent of the second air circulation system between the external space and the second space by sliding the air supply component in a straight-line direction. For other structures of the cabinet, refer to the embodiments corresponding to FIG. 1 to FIG. 7, for example, refer to the structures of the first air intake structure, the second air intake structure, and the air exhaust structure, and a heat exchange form between the air exhaust structure and the first air circulation system.

In addition to switching the air supply component between the first state and the second state, so that the air intake vent of the air supply component can be selectively connected to the external space or the second space, the second air circulation system may alternatively be in the following form.

Figure 10:
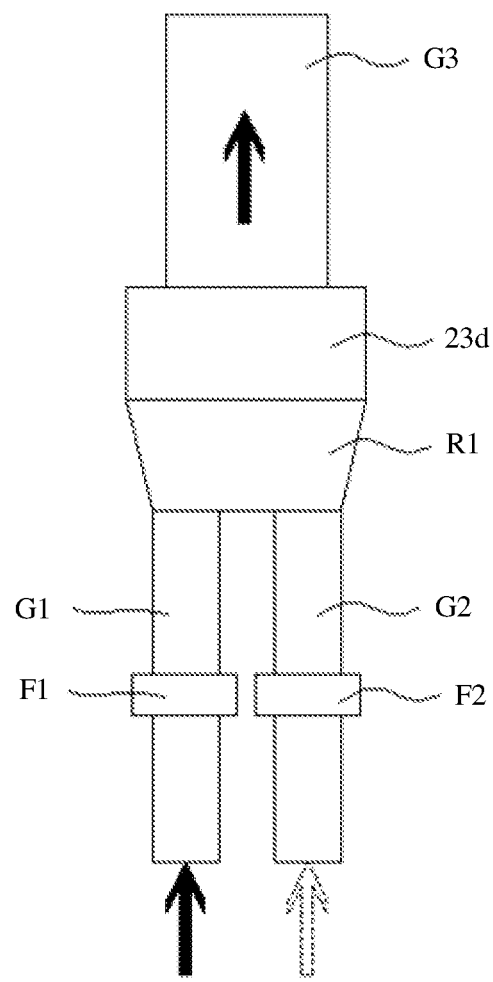
FIG. 10 is a schematic diagram of a local structure of another second air circulation system in a cabinet according to an embodiment.

FIG. 10 is a schematic diagram of a local structure of another second air circulation system in a cabinet according to an embodiment. The second air circulation system includes an air supply component 23d, an air collecting hood R1, a first air intake structure G1, a second air intake structure G2, and an air exhaust structure G3. The air supply component 23d may be a centrifugal fan or an axial flow fan. For example, both air exhaust vents of the first air intake structure G1 and the second air intake structure G2 are connected to an air intake vent of the air collecting hood R1. An air exhaust vent of the air collecting hood R1 is covered on an air intake vent of the air supply component 23d. An air exhaust vent of the air supply component 23d is connected to the external space through the air exhaust structure G3, and the air exhaust structure R1 exchanges heat with the first air circulation system. In FIG. 10, the first air intake structure G1, the second air intake structure G2, and the air exhaust structure G3 each are in a form of a pipeline, and a valve F1 and a valve F2 are respectively disposed on the first air intake structure G1 and the second air intake structure G2, to respectively control open and close of the first air intake structure G1 and the second air intake structure G2. If the valve F1 is opened and the valve F2 is closed, the air intake vent of the air supply component 23d is connected to the external space through the first air intake structure G1; if the valve F1 is closed and the valve F2 is opened, the air intake vent of the air supply component 23d is connected to the second space of the cabinet through the second air intake structure G1; or if the valve F1 and the valve F1 are simultaneously opened, the air intake vent of the air supply component 23d is simultaneously connected to the external space and the second space. However, this is merely an example. The first air intake structure, the second air intake structure, and the air exhaust structure may alternatively use the forms of the structures with the same names as described above. The first air circulation system further has a first switch (for example, the foregoing valve F1 or an air baffle that can be inserted in the first air intake structure) that controls open and close of the first air intake structure, and a second switch (for example, the foregoing valve F2 or an air baffle that can be inserted in the second air intake structure) that controls open and close of the second air intake structure. For a structure not mentioned in this embodiment, refer to the embodiments corresponding to FIG. 1 to FIG. 7.

In the foregoing embodiments, the second air circulation system has the first air intake structure and the second air intake structure, and controls, by determining whether the first air intake structure and the second air intake structure supply air to the air supply assembly, the air intake vent of the second air circulation system to obtain air from the external space, the second space, or both the external space and the second space. However, this is merely an example. Another form may alternatively be used, provided that the air exhaust vent of the second air circulation system can be connected to the external space, and the air intake vent of the second air circulation system can be selectively connected to the external space and/or the second space. For example, each air supply component in the air supply assembly is still connected to the external space through the air exhaust structure, the air intake vent of each of at least some air supply components is connected to one end of a hose, and an air intake vent at the other end of the hose may be selectively exposed to the external space or inserted in the second space as required.

In addition, the air supply component may be disposed outside the air duct, inside an air duct, inside several air ducts or may drive an air flow to flow in a corresponding direction in the foregoing embodiments.

An embodiment may further provide a heat exchange module used in the cabinet provided in any one of the foregoing embodiments.

The heat exchange module has a first air circulation system and a second air circulation system configured to exchange heat with the first air circulation system, where both an air intake vent and an air exhaust vent of the first air circulation system are configured to be connected to the first space of the cabinet body; and an air exhaust vent of the second air circulation system is connected to an external space, and an air intake vent of the second air circulation system may be configured to be selectively connected to the external space, the second space of the cabinet body, or both the first space and the second space.

FIG. 2 and FIG. 3 are used as examples. The first air circulation system includes an air duct T5, an air supply component 25a, and an air duct T4. The air supply component T5 drives air in the first space S1 to enter the air duct T4 through the air duct T5, and then the air is cooled by the evaporator 24 and returns to the first space S1. In addition, the second air circulation system includes an air duct T1, an air duct T2, an air supply component 23a, and an air duct T3. The air supply component 23a is flipped, so that the air supply component 23a can selectively obtain air from the external space or the second space, the air discharged from the air supply component 23a reaches the air duct T3, the air in the air duct T3 cools the condenser 22, and the condenser 22 is connected to the evaporator 24 through a liquid pipeline for heat exchange. In this way, heat exchange between the first air circulation system and the second air circulation system is implemented. This is merely an example. For another possible implementation of the heat exchange module, refer to the form of the heat exchange module 20 in the cabinet provided in any one of the foregoing embodiments.

It should be noted that, in the foregoing embodiments, the directional terms such as "upper" and "lower" are merely described for the accompanying drawings and are intended to facilitate understanding.

In addition, all components in the accompanying drawings in the embodiments are merely used to indicate an operation principle of a heat exchangeable module or a cabinet, and do not truly reflect an actual size relationship of the components.

The foregoing descriptions are merely implementations, but are not intended to limit the scope of the embodiments. Any variation or replacement readily figured out by a person skilled in the art shall fall within the scope of the embodiments.

What is claimed is:

1. A heat exchange module, used in a cabinet, wherein the cabinet comprises a cabinet body, the cabinet body has a first space and a second space, and the second space has an air intake vent; and the heat exchange module comprises:
a first air circulation system; and
a second air circulation system configured to exchange heat with the first air circulation system, wherein both an air intake vent and an air exhaust vent of the first air circulation system are configured to be connected to the first space, and an air exhaust vent of the second air circulation system is connected to an external space, and an air intake vent of the second air circulation system is configured to be selectively connected to the external space and/or the second space;
wherein the second air circulation system further comprises:
an air supply assembly;
a first air intake structure;
a second air intake structure; and
an air exhaust structure; and
wherein both an air exhaust vent of the first air intake structure and an air exhaust vent of the second air intake structure are connected to an air intake vent of each air supply component; and
a first switch is connected to the first air intake structure.

2. The heat exchange module according to claim 1, wherein
the air supply assembly comprises at least one air supply component, wherein an air exhaust vent of each air supply component is connected to the external space through the air exhaust structure, and an air intake vent of each air supply component is configured to be selectively connected to the external space through the first air intake structure or connected to the second space through the second air intake structure.

3. The heat exchange module according to claim 2, wherein when each air supply component is in a first state, the air intake vent of the air supply component is connected to an air exhaust vent of the first air intake structure; or
when each air supply component is in a second state, the air intake vent of the air supply component is connected to an air exhaust vent of the second air intake structure.

4. The heat exchange module according to claim 3, wherein the air exhaust vent of the first air intake structure is disposed opposite to the air exhaust vent of the second air intake structure; each air supply component is located between the air exhaust vent of the first air intake structure and the air exhaust vent of the second air intake structure; and when the air supply component is in the first state, the air intake vent of the air supply component is disposed opposite to the air exhaust vent of the first air intake structure, or
when the air supply component is in the second state, the air intake vent of the air supply component is disposed opposite to the air exhaust vent of the second air intake structure.

5. The heat exchange module according to claim 4, wherein an air intake direction of each air supply component is perpendicular to an air exhaust direction; an air intake vent of the air exhaust structure is disposed opposite to a gap between the air exhaust vent of the first air intake structure and the air exhaust vent of the second air intake structure; and
when each air supply component is in the first state and in the second state, the air exhaust vent of the air supply component is disposed opposite to the air intake vent of the air exhaust structure.

6. The heat exchange module according to claim 3, wherein the air exhaust vent of the first air intake structure and the air exhaust vent of the second air intake structure are disposed side by side with a same direction; and each air supply component is configured to slide in an arrangement direction of the air exhaust vent of the first air intake structure and the air exhaust vent of the second air intake structure.

7. The heat exchange module according to claim 2, wherein each air supply component is a centrifugal fan.

8. The heat exchange module according to claim 2, wherein
the first switch configured to control open and close of the first air intake structure is disposed on the first air intake structure, and a second switch configured to control open and close of the second air intake structure is disposed on the second air intake structure.

9. The heat exchange module according to claim 2, wherein the second air circulation system further comprises a third air intake structure; and an air intake vent of the third air intake structure is configured to be connected to the second space, and an air exhaust vent of the third air intake structure is connected to the air exhaust vent of the first air intake structure.

10. The heat exchange module according to claim 9, wherein an air volume of the third air intake structure is less than an air volume of the first air intake structure.

11. A cabinet comprising:
a cabinet body; and
a heat exchange module, wherein the heat exchange module, used in the cabinet, wherein the cabinet body has a first space and a second space, and the second space has an air intake vent; and the heat exchange module has a first air circulation system and a second air circulation system configured to exchange heat with the first air circulation system, wherein both an air intake vent and an air exhaust vent of the first air circulation system are configured to be connected to the first space, and an air exhaust vent of the second air circulation system is connected to an external space, and an air intake vent of the second air circulation system is configured to be selectively connected, using a first switch and a second switch, to the external space and/or the second space.

* * * * *